United States Patent [19]
Son

[11] Patent Number: 6,110,769
[45] Date of Patent: Aug. 29, 2000

[54] SOI (SILICON ON INSULATOR) DEVICE AND METHOD FOR FABRICATING THE SAME

[75] Inventor: Jeong Hwan Son, Taejeon-si, Rep. of Korea

[73] Assignee: LG Semicon Co., Ltd., Chungcheongbuk-do, Rep. of Korea

[21] Appl. No.: 09/197,580

[22] Filed: Nov. 23, 1998

[30] Foreign Application Priority Data

Dec. 15, 1997 [KR] Rep. of Korea ..................... 97-68702

[51] Int. Cl.⁷ .................................................. H01L 21/76
[52] U.S. Cl. ......................... 438/164; 438/406; 438/459; 438/977
[58] Field of Search ..................................... 438/455, 456, 438/457, 458, 406, 459, FOR 485, 977

[56] References Cited

U.S. PATENT DOCUMENTS

| | | | |
|---|---|---|---|
| 4,970,175 | 11/1990 | Haisma et al. | 438/456 |
| 5,091,330 | 2/1992 | Cambou et al. | 438/459 |
| 5,260,233 | 11/1993 | Buti et al. | 438/455 |
| 5,521,399 | 5/1996 | Chu et al. | 257/36 |
| 5,528,054 | 6/1996 | Ipposhi et al. | 257/66 |
| 5,597,739 | 1/1997 | Sumi et al. | 438/459 |

OTHER PUBLICATIONS

Terukazu Ohno et al., International Electron Devices Meeting 1995(IEDM 95), pp. 627–630.

H.F. Wei et al., International Electron Devices Meeting 1993 (IEDM 93), pp. 739–742.

*Primary Examiner*—Mary Wilczewski
*Assistant Examiner*—Yung A. Lin

[57] ABSTRACT

An SOI device and a method for fabricating the same in which floating body effect is reduced and the performance is thus improved are disclosed, the SOI device including a semiconductor substrate; a first buried insualting film formed on the semiconductor substrate; a first conductivity type silicon layer formed on the first buried insulating film; an active region and a first conductivity type semiconductor layer formed to be isolated on predetermined areas of the first conductivity type silicon layer; second buried insulating films formed to be isolated from one another in the first conductivity type silicon layer to connect the first conductivity type semiconductor layer with the active region through the first conductivity type silicon layer; a gate electrode formed on the active region; impurity region formed in the semiconductor substrate at both sides of the gate electrode; and contact pads formed on the first conductivity type silicon layer.

10 Claims, 11 Drawing Sheets etched region of first buried oxide film

SOI (SILICON ON INSULATOR) DEVICE AND METHOD FOR FABRICATING THE SAME

BACKGROUND OF THE INVENTION

1. Field of the Invention

The present invention relates to a semiconductor device and, more particularly, to an SOI device and a method for fabricating the same in which floating body effect is reduced and the performance is thus improved.

2. Discussion of the Related Art

A background art SOI device will be described with reference to the accompanying drawings.

FIG. 1 is a cross-sectional view of a background art SOI device. This background art SOI device, constituting a CMOS transistor, includes a buried oxide film 2 formed on a semiconductor substrate 1, a p type semiconductor layer 4 doped with p type ions and formed on a predetermined area of the buried oxide film 2, and an n type semiconductor layer 5 formed on a predetermined area of the buried oxide film 2 and spaced apart from the p type semiconductor layer 4. An isolation oxide film 3 is formed to have a higher height than the p and n type semiconductor layers 4 and 5 to isolate the p type semiconductor layer 4 from the n type semiconductor layer 5.

A gate-oxide film 6 and a first gate electrode 7a are formed on a predetermined area of the p type semiconductor layer 4. Source/drain regions 8a/8b having an LDD structure are formed in the p type semiconductor layer 4 at both sides of the first gate electrode 7a. Sidewall spacers are formed on the both sides of the first gate electrode 7a.

A gate oxide film 6 and a second gate electrode 7b are formed on a predetermined area of the n type semiconductor layer 5. Source/drain regions 9a/9b having an LDD structure are formed in the n type semiconductor layer 5 at both sides of the second gate electrode 7b. Sidewall spacers are formed on both sides of the second gate electrode 7b.

While an NMOS transistor is formed in the p type semiconductor layer 4, a PMOS transistor is formed in the n type semiconductor layer 5.

An interlayer insulating film 10 are formed to have contact holes on the source/drain regions 8a/8b and 9a/9b and the first and second gate electrodes 7a and 7b. Line layers 11a, 11b, 11c, 11d, 11e, and 11f, are formed in the contact holes and on the interlayer insulating film adjoining to the contact holes.

As described above, p and n type semiconductor layers 4 and 5, which serve as channels of NMOS transistor and PMOS transistor, float in the background art SOI device.

Such a background art SOI device has the following problems. A p type semiconductor layer and an n type semiconductor layer, serving as channels of NMOS and PMOS transistors, are electrically connected, yet float, so that break down voltage is reduced and floating body effect is generated so that errors in current-voltage curve are generated. Accordingly the operation characteristic becomes inferior.

SUMMARY OF THE INVENTION

Therefore, the present invention is directed to an SOI device and a method for fabricating the same that substantially obviates one or more of problems due to limitations and disadvantages of the related art.

An object of the invention is to provide an SOI device and a method for fabricating the same in which channel regions of NMOS and PMOS transistors are electrically connected to first and second conductivity type semiconductor layers, respectively, having contact pads through first and second conductivity type polysilicon layers, thereby reducing floating body effect and thus improving the operation characteristic.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the SOI device includes a semiconductor substrate; a first buried insualting film formed on the semiconductor substrate; a first conductivity type silicon layer formed on the first buried insulating film; an active region and a first conductivity type semiconductor layer formed to be isolated on predetermined areas of the first conductivity type silicon layer; second buried insulating films formed to be isolated from one another in the first conductivity type silicon layer to connect the first conductivity type semiconductor layer with the active region through the first conductivity type silicon layer; a gate electrode formed on the active region; impurity region formed in the semiconductor substrate at both sides of the gate electrode; and contact pads formed on the first conductivity type silicon layer.

In another aspect of the present invention, a method for fabricating an SOI device includes the steps of forming first insulating films formed in a first semiconductor substrate to be spaced apart by a predetermined distance; forming first insulating layers to expose predetermined areas of the first semiconductor substrate between the first films; forming a first silicon layer on the first semiconductor substrate including the first buried insulating layers; forming a second buried insulating layer on a second semiconductor substrate; bonding the first silicon layer with the second buried insulating layer; polishing the first semiconductor substrate until the first insulating films are exposed to form semiconductor layers of first and second regions; implanting ions into the first silicon layer to form a first conductivity type silicon layer; forming a gate electrode on the semiconductor layer of the first region; implanting ions into the semiconductor layer of the second region to form a second conductivity type semiconductor layer; forming impurity regions in the semiconductor layer of the first region at both sides of the gate electrode; and forming a contact pad in contact with the second conductivity type semiconductor layer and simultaneously line layers in contact with the impurity regions.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
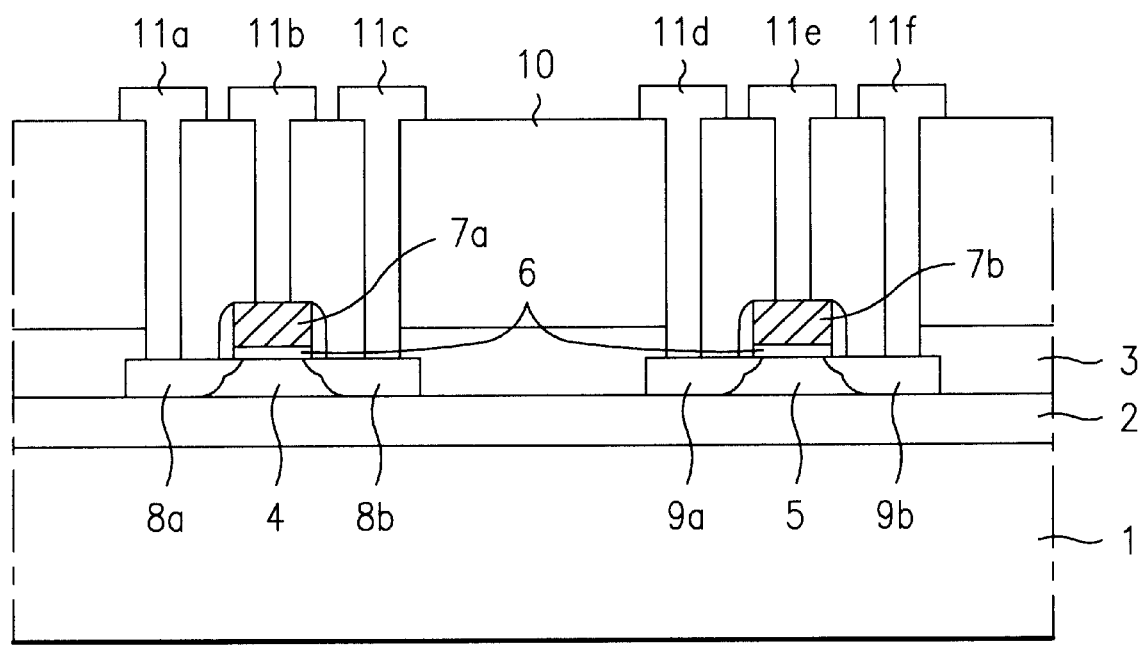
FIG. 1 is a cross-sectional view showing a structure of a background art SOI device.
Figure 2A:
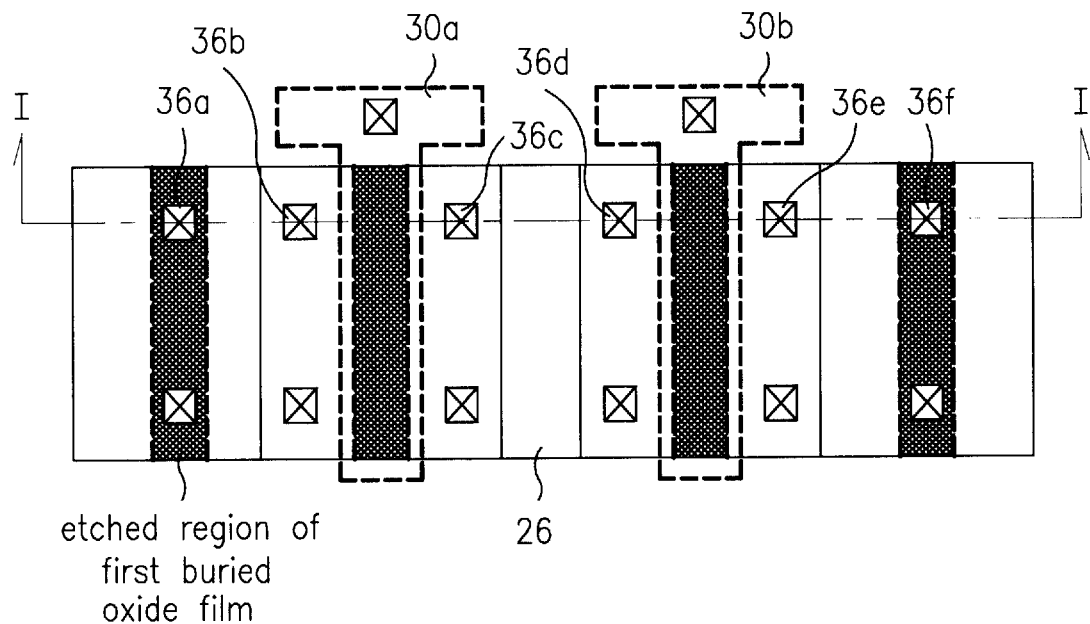
FIG. 2A is a plan view of an SOI device according to a first embodiment of the present invention.
Figure 2B:
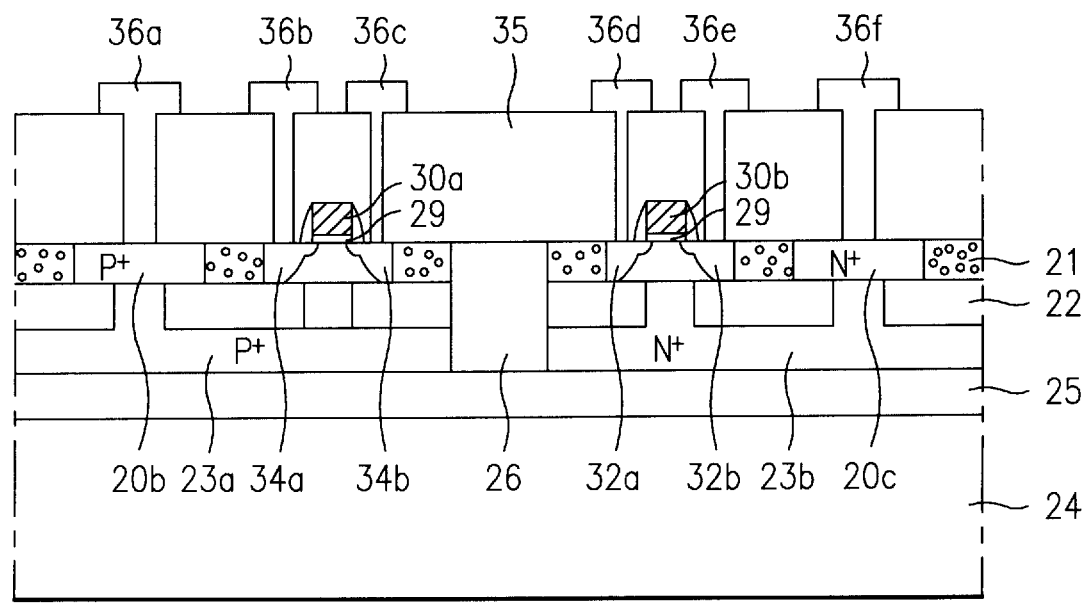
FIG. 2B is a cross-sectional view showing a structure of the SOI device, taken along line I—I of FIG. 2A.
Figure 3A:
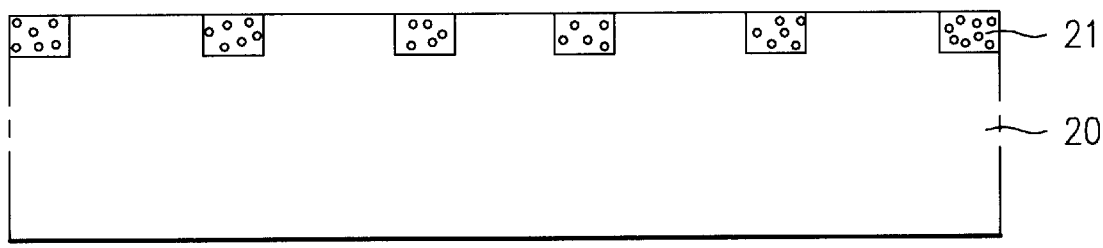
FIGS. 3A to 3K are cross-sectional views showing process steps of a method for fabricating the SOI device, taken along line I—I of FIG. 2A.
Figure 3B:
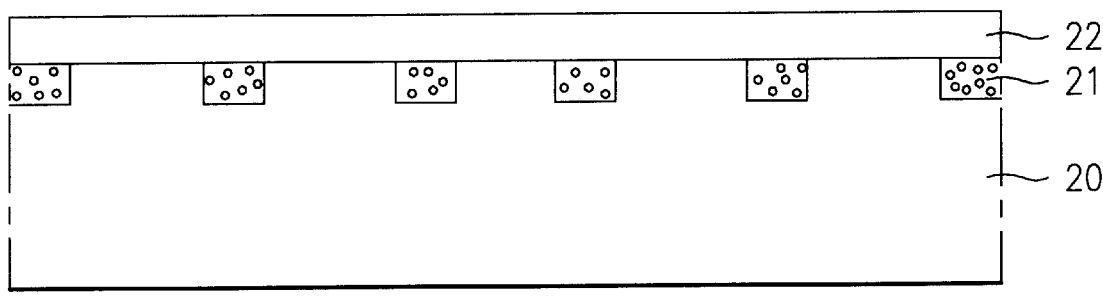
Figure 3C:
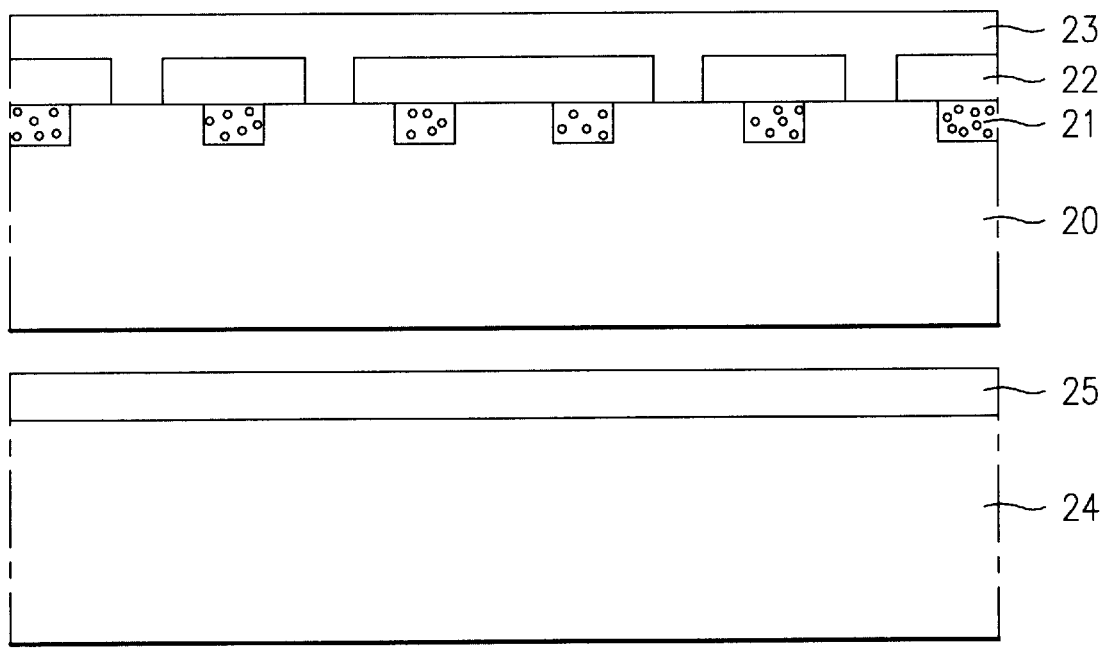
Figure 3D:
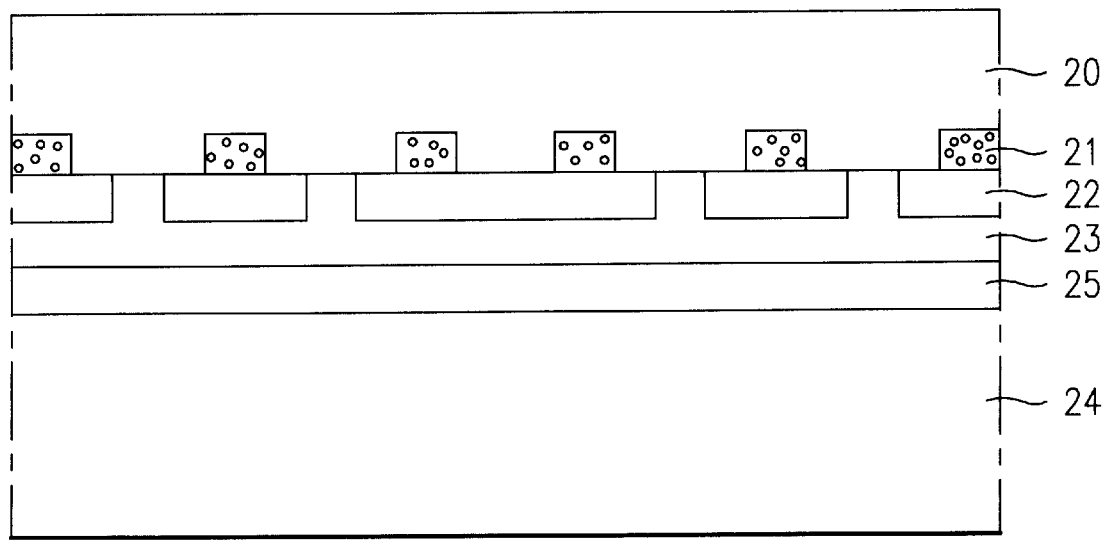
Figure 3E:
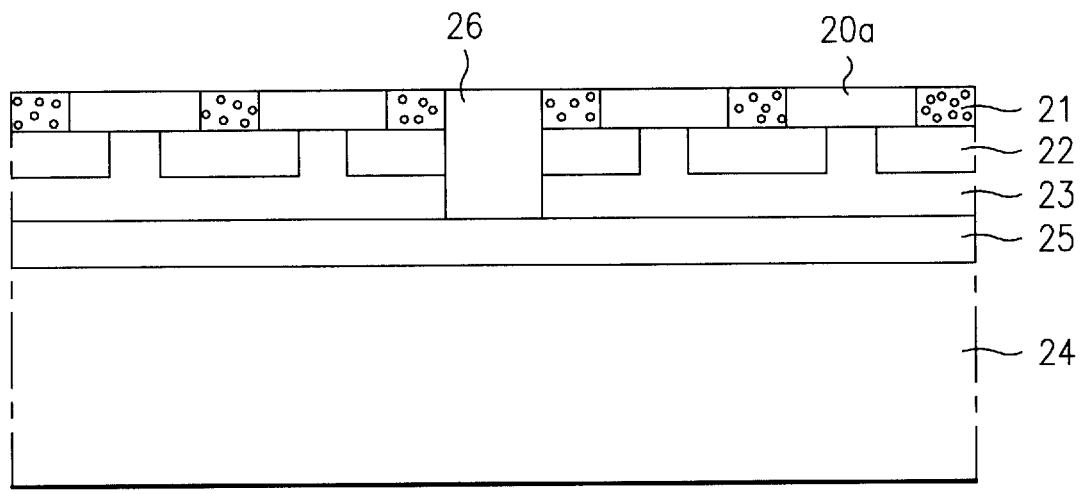
Figure 3F:
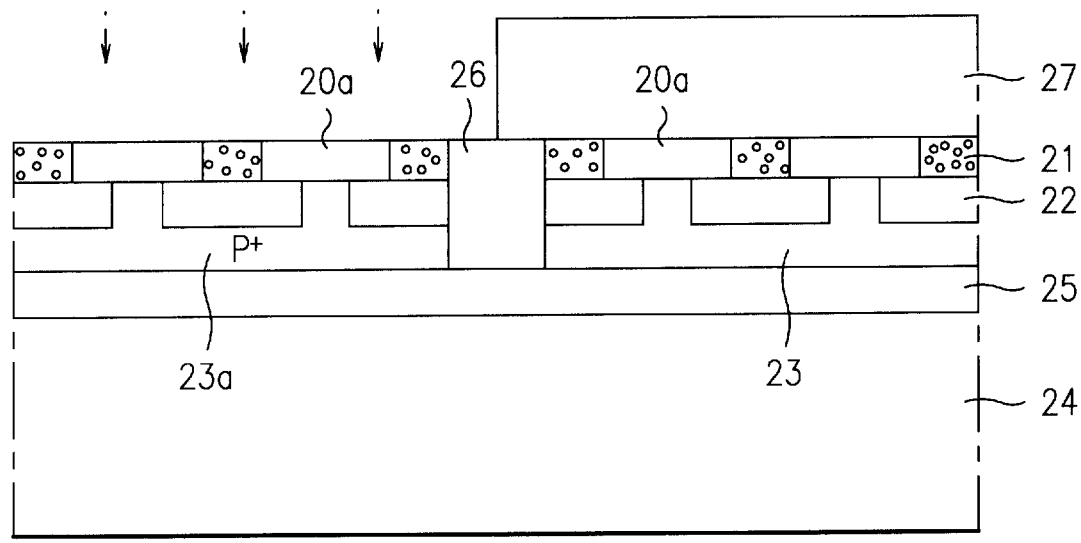
Figure 3G:
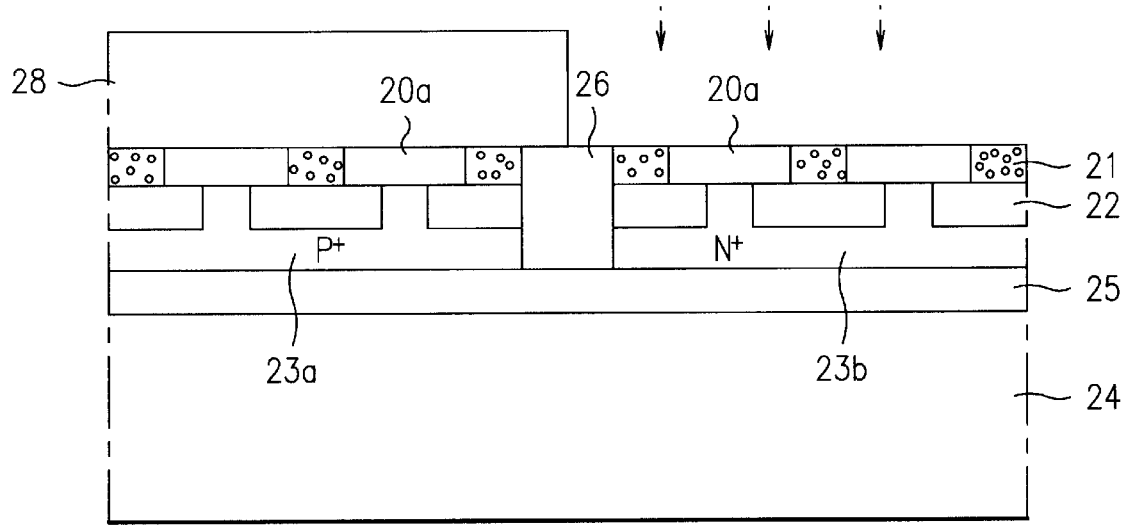
Figure 3H:
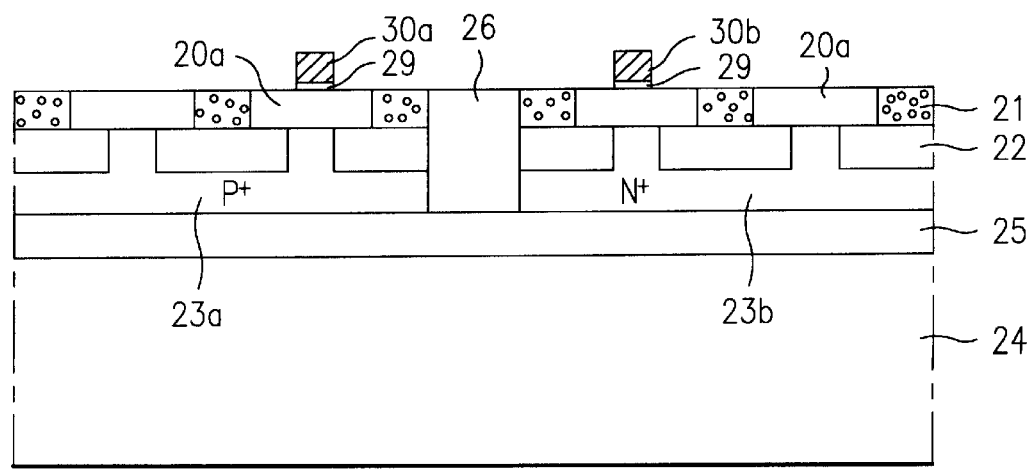
Figure 3I:
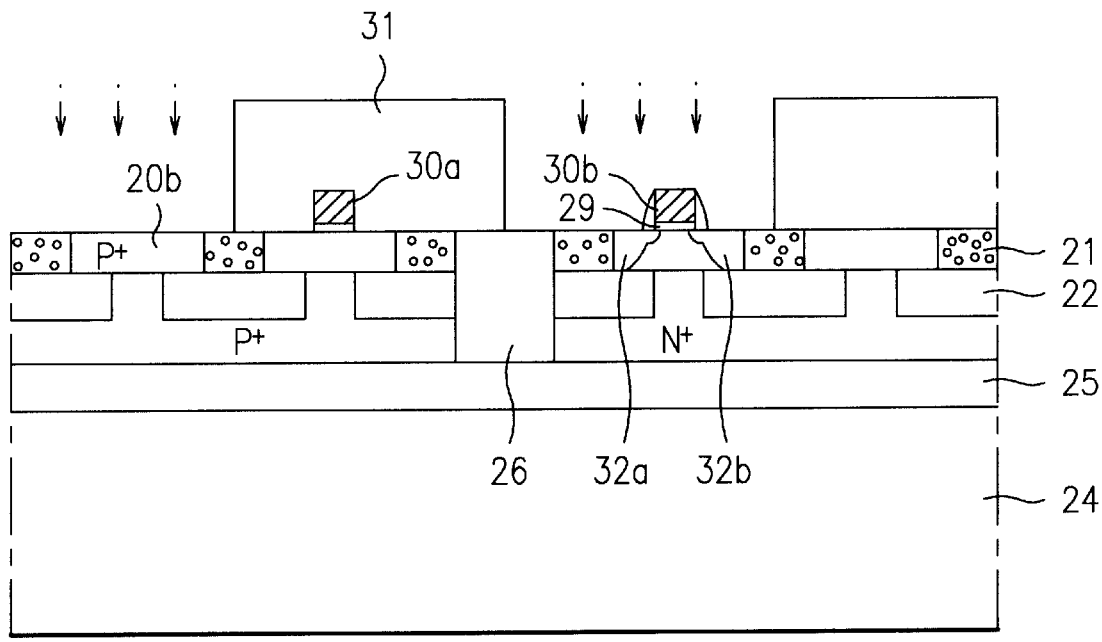
Figure 3J:
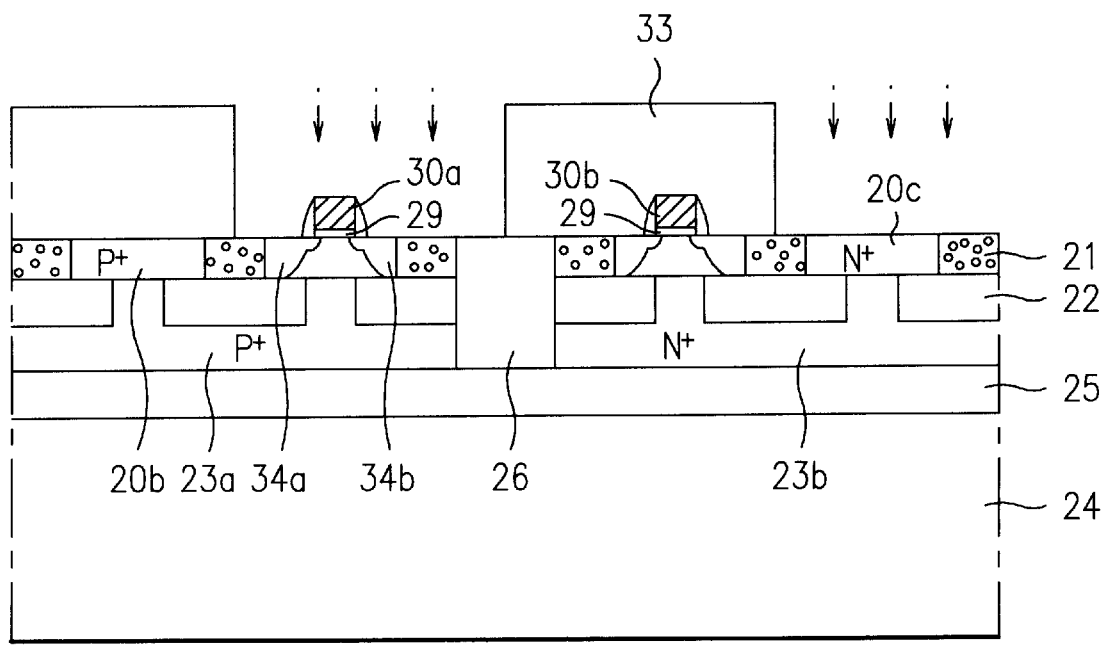
Figure 3K:
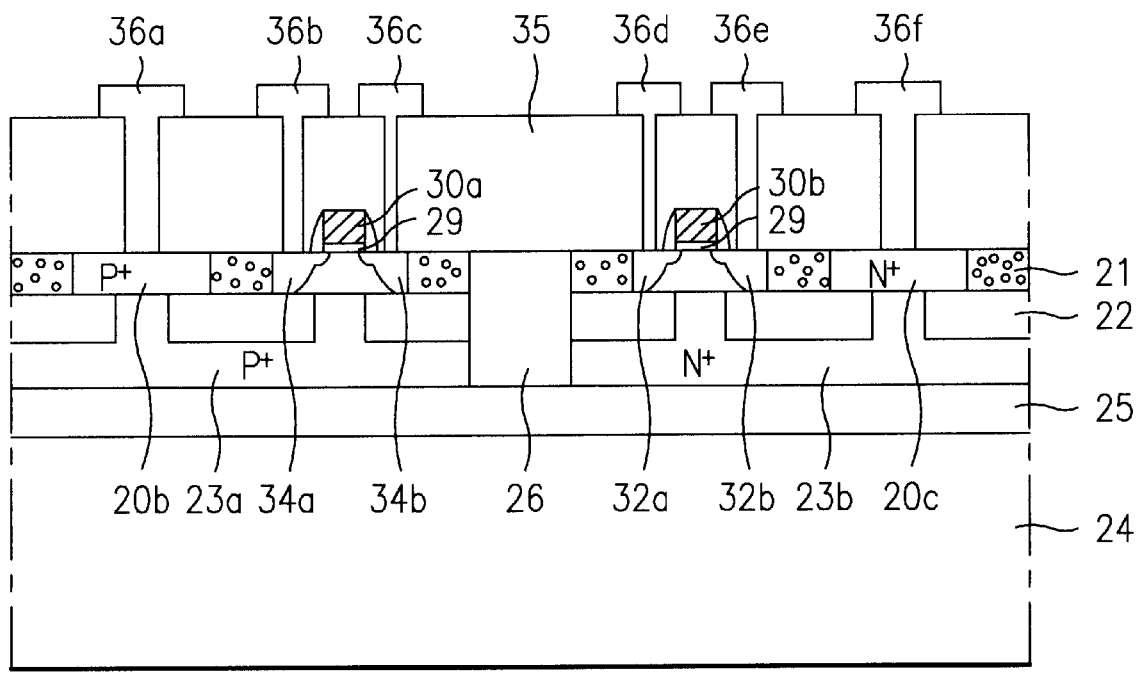
Figure 4A:
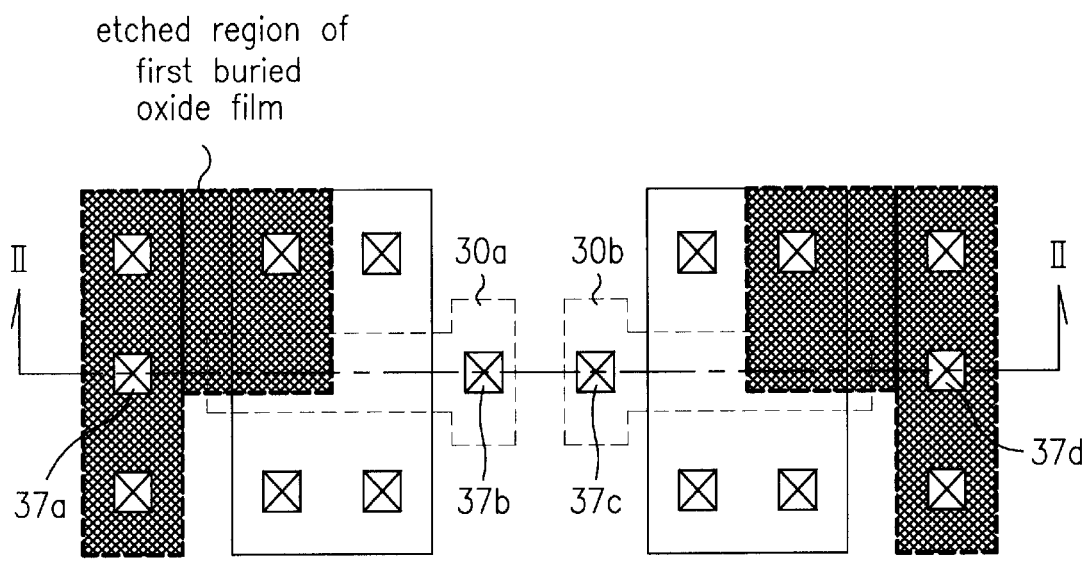
FIG. 4A is a plan view of an SOI device according to a second embodiment of the present invention.
Figure 4B:
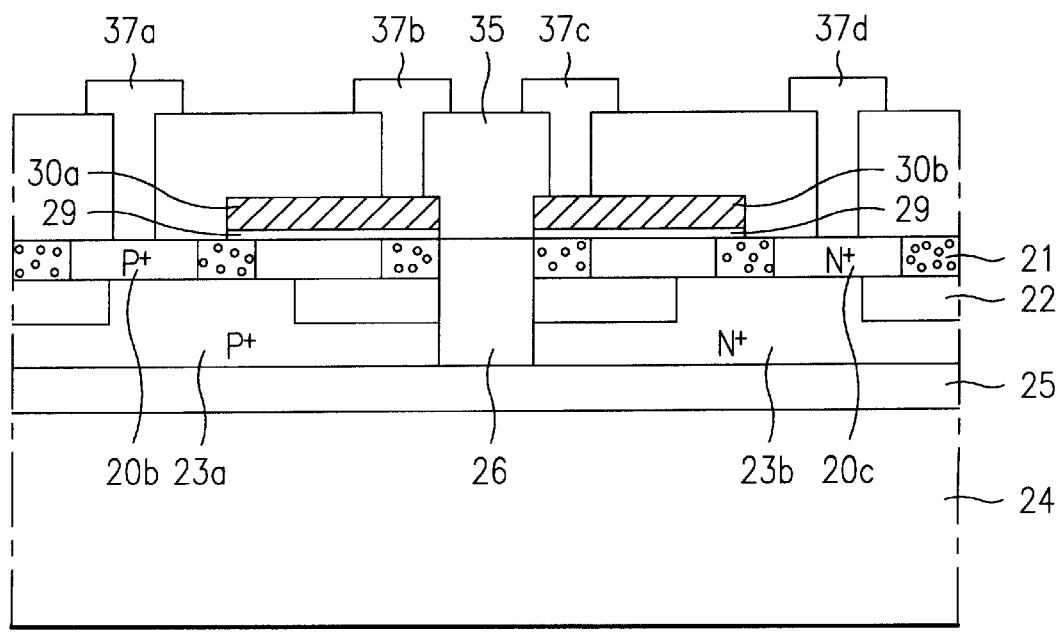
FIG. 4B is a cross-sectional view showing a structure of the SOI device, taken along line II—II of FIG. 4A.
Figure 5A:
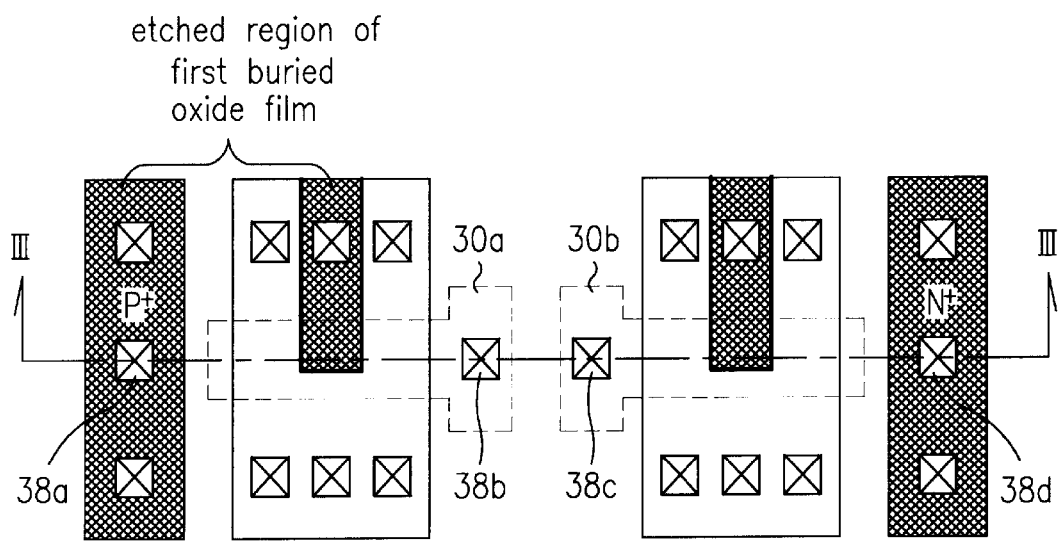
FIG. 5A is a plan view of an SOI device according to a third embodiment of the present invention.
Figure 5B:
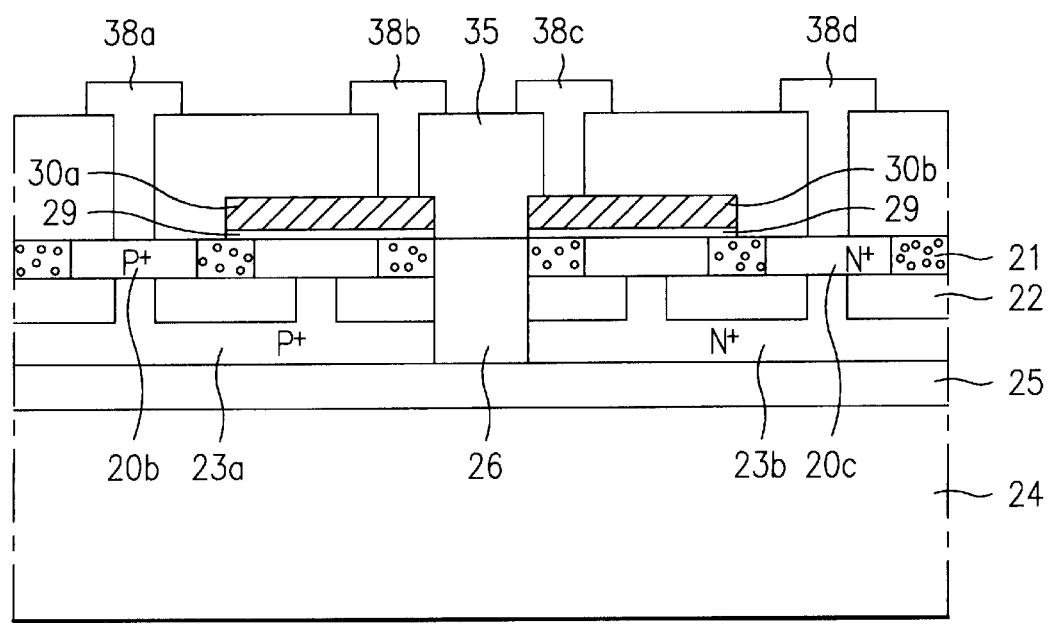
FIG. 5B is a cross-sectional view showing a structure of the SOI device, taken along line of III—III of FIG. 5A.
Figure 6A:
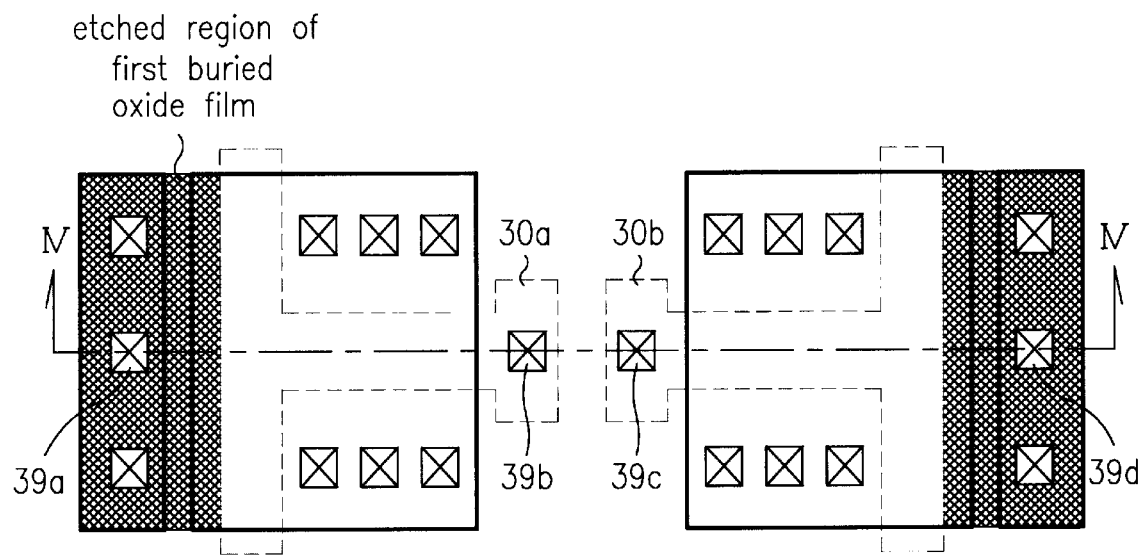
FIG. 6A is a plan view of an SOI device according to a fourth embodiment of the present invention.
Figure 6B:
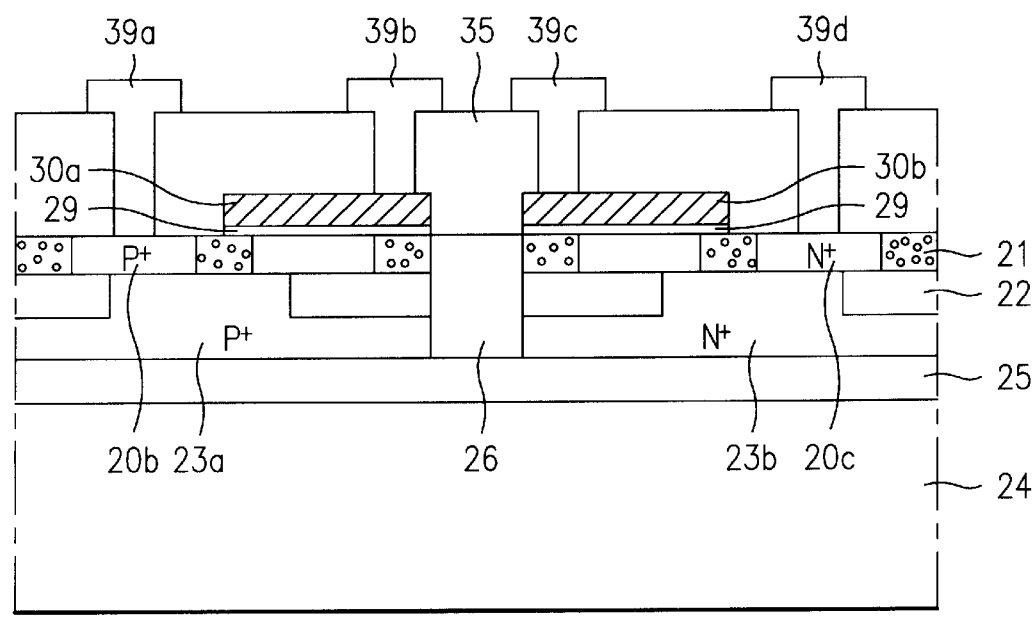
FIG. 6B is a cross-sectional view showing a structure of the SOI device, taken along line of IV—IV of FIG. 6A.

FIG. 2A is a plan view of an SOI device according to the first embodiment of the present invention, FIG. 2B is a cross-sectional view showing a structure of the SOI device, taken along line I—I of FIG. 2A, FIGS. 3A to 3K are cross-sectional views showing process steps of a method for fabricating the SCI device, taken along line I—I of FIG. 2A, FIG. 4A is a plan view showing an SOI device according to the second embodiment of the present invention, FIG. 4B is a cross-sectional view showing a structure of the SOI device, taken along line II—II of FIG. 4A, FIG. 5A is plan view of an SOI device according to the third embodiment of the present invention, FIG. 5B is a cross-sectional view of a structure of the SOI device, taken along line of III—III of FIG. 5A, FIG. 6A is a plan view of an SOI device according to the fourth embodiment of the present invention, and FIG. 6B is a cross-sectional view showing a structure of the SOI device, taken along line of IV—IV of FIG. 6A.

As shown in FIGS. 2A and 2B according to the first embodiment of the present invention, a second buried oxide film 25 is formed on a second semiconductor substrate 24. p and n type heavily doped polysilicon layers 23a and 23b are formed on the second buried oxide film 25 and isolated from each other by an isolation oxide film 26 formed on the buried oxide film 25. First buried oxide films 22a are formed in the p and n type heavily doped polysilicon layers 23a and 23b to be spaced apart.

A p type semiconductor layer 20b and a first active region are formed on the first buried oxide film 22a, spaced apart from the p type heavily doped polysilicon layer 23a. A first oxide film 21 is formed between the p type semiconductor layer 20b and the first active region.

An n type semiconductor layer 20c and a second active region are formed on the first buried oxide film 22a, spaced apart from the n type heavily doped. A first oxide film 21 is formed between the n type semiconductor layer 20b and the second active region.

A gate oxide film 29 and a first gate electrode 30a are successively formed on the first active region on the p type heavily doped polysilicon layer 23a. Source/drain regions 34a/34b are formed in the first active region at both sides of the first gate electrode 30a.

A gate oxide film 29 and a second gate electrode 23b are successively formed on the second active region on the n type heavily doped polysilicon layer 23b. Source/drain region 32a/32b are formed in the second active region at both sides of the second gate electrode 39b.

Formed is an interlayer insualting film 35 having contact holes on the p and n type semiconductor layers 20b and 20c and the source/drain regions 32a/32b and 34a/34b. Contact pads 36a and 36f and line layers 36b, 36c, 36d, and 36e are formed in the contact holes and on the interlayer insulating layer adjoining to the contact holes.

According to the first embodiment of the present invention, the first and second active regions are connected to the p and n type semiconductor layers 20b and 20c through the p and n type polysilicon layers 23a and 23b, respectively.

According to the second embodiment of the present invention, a second buried oxide film 25 is formed on a second semiconductor substrate 24 as shown in FIGS. 4A and 4B. p and n type heavily doped polysilicon layers 23a and 23b are formed on the second buried oxide film 25 and spaced apart from each other by an isolation oxide film 26. First buried oxide films 22 are formed in the p and n type heavily doped polysilicon layers 23a and 23b.

These first buried oxide films 22 are under a contact pad 37a on the p type semiconductor layer 20a on the p type heavily doped polysilicon layer 23a and under portion of the source/drain region and a corner portion of the first gate electrode 30a.

The first buried oxide films 22 are under a contact pad 37d on the n type semiconductor layer 20c on then type heavily doped polysilicon layer 23b and under portion of the source/drain region and a corner portion of the second gate electrode 30b.

A p type semiocnductor layer 20b and a first active region are formed to spaced apart from each other on the first buried oxide films 22. A first oxide film 21 is formed between the p type semiconductor layer 20b and the first active region.

An n type semiconductor layer 20c and a second active region are formed to be spaced apart from each other on the first buried oxide film 22. Another oxide film 21 is formed between the n type semiconductor layer 20b and the second active region.

First and second gate electrodes 30a and 30b are formed to cross the first and second active regions, respectively. Source/drain regions are formed in the first and second active regions at both sides of the first and second gate electrodes 30a and 30b, respectively.

Formed is an interlayer insulating film 35 having contact holes on the p type semiconductor layer 20b, the source/drain regions, and the first and second gate electrodes 30a and 30b. Contact pads 37a and 37d and line layers 37b and 37c are formed in the contact holes and on the interlayer insualting film 35 adjoining to the contact holes.

The SOI device of the third embodiment shown in FIGS. 5A and 5B has an identical structure with that of the second embodiment except for etched portion of the first buried oxide film 22.

According to the third embodiment, a first buried oxide film 22 is etched under a p type semiconductor layer 20b under the contact pad 38a, under center portion of a source or drain region, and under center portion of a first gate electrtode 30a adjoining to the source or drain region, thereby forming first buried oxide films 22.

A first buried oxide film 22 is etched under an n type semiconductor layer 20c under a contact pad 38d, under center portion of a source or drain region, and under center portion of a second gate electrode 30b adjoining to the source or drain region.

The SOI device of the fourth embodiment shown in FIGS. 6A and 6B has an identical structure with that of the second embodiment except for etched portion of the first buried oxide film 22 and shapes of the first and second gate electrodes 30a and 30b.

According to the fourth embodiment, the first buried oxide film 22 is etched under a p type semiconductor layer 20b under a contact pad 39a, and under part of a first active region except a first gate electrode 30a and source/drain regions.

The first buried oxide film 22 is etched under an n type semiconductor layer 20c under a contact pad 39d, and under part of a second active region except a second gate electrode 30b and source/drain regions.

FIGS. 3A to 3K are cross-sectional views showing process steps of a method for fabricating an SOI device, taken along line I—I of FIG. 2A.

Referring initially to FIG. 3A, a first semiconductor substrate 20 is etched by a predetermined depth to form a plurality of trenches. Subsequently, an oxide film is deposited on the first semiconductor substrate 20 including the trenches. Next, a CMP process is carried out so that formed is a first oxide film 21 filling the trenches. This oxide film 21 is 500–1500 Angstrom thick.

Referring to FIG. 3B, a 500~3000 Angstrom thick first buried oxide film 22 is formed on the first semiconductor substrate 20 with a CVD process.

Referring to FIG. 3C, a photoresist film is coated on the first buried oxide film 22 and patterned with an exposure and development process to expose predetermined areas of the first buried oxide film 22 between the trenches but not areas of the first film 22 for placements of CMOS transistors between the trenches. With the patterned photoresist film serving as a mask, the first buried oxide film 22 is removed to expose the semiconductor substrate 20. Thereafter, a 2000~6000 Angstrom thick undoped polysilicon layer is deposited on the first buried oxide film 22 and the first semiconductor substrate 20 and then is subjected to an etch-back process or a CMP process, thus forming a 1000~2000 Angstrom thick undoped polysilicon layer 23.

On the other hand, a 1000~4000 Angstrom thick second buried oxide film 25 is deposited on a second semiconductor substrate 24 with a CVD process or a thermal oxidation process.

Referring to FIG. 3D, the undoped polysilicon layer 23 on the first semiconductor substrate 20 and the second buried oxide film 25 on the second semiconductor substrate 24 are heated them at a temperature of 850~1050° C. so that they are bonded to each other.

Referring to FIG. 3E, the first semiconductor substrate 20 is polished with a CMP process for planarization until the first oxide film 21 is exposed. At this time, the difference between the etch rates of the first substrate 20 and the first oxide film 21 is used to polish the first substrate 20, and this first oxide film 21 serves as an etch stop. Thereafter, in order to isolate a CMOS transistor, the semiconductor layers 20a between the first oxide films 21, the first buried oxide film 22, and the undoped polysilicon layer 23 are etched to form a trench isolation region. An oxide film is deposited on the first oxide film 21 and the semiconductor layer 20a and the trench isolation regions and planarized with a CMP process to form an isolation oxide film 26.

Referring to FIG. 3F, a photoresist film 27 is coated on the first oxide film 21, the semiconductor layer 20a, and the isolation oxide film 26, and patterned with an exposure and development process to be removed at one whole side of the isolation oxide film 26. With the patterned photoresist film 27 serving as a mask, boron ions having a concentration of 5E14~1E15 cm$^{-2}$ are injected into the undoped polysilicon layer 23, which thus becomes a p type heavily doped polysilicon layer 23a.

Referring to FIG. 3G, another photoresist film 28 is coated on the first oxide film 21, the semiconductor layer 20a, and the isolation oxide film 26, and patterned with an exposure and development process to be removed at the other side of the isolation oxide film 26. With patterned photoresist film 28 serving as a mask, phosphorus ions having a concentration of 5E14~1E15 cm$^{-2}$ are injected into the undoped polysilicon layer 23a, which thus becomes an n type heavily doped polysilicon layer 23b. At this time, an ion-implanting process for adjusting threshold voltage can be carried out after depositing p and n type polysilicon layers 23a and 23b.

Referring to FIG. 3H, an oxide film and a silicon layer are deposited on the entire surface and anisotropically etched so that a gate oxide film 22 and a first gate electrode 30a for an NMOS transistor and a gate oxide film 22 and a second gate electrode 30b for a PMOS transistor are formed on the semiconductor layers 20a under which the first buried oxide film 22 is etched out. At this time, both the first and second gate electrodes 30a and 30b, for example, are made of n type doped polysilicon. Or, the first and second gate electrodes 30a and 30b for NMOS and PMOS transistors, respectively, are made of n type doped polysilicon and p type doped polysilicon, respectively. In order to reduce resistance of the first and second gate electrodes 30a and 30b, a metal layer or a metal silicide layer can be further formed on the first and second gate electrodes 30a and 30b.

Referring to FIG. 3I, a photoresist film 31 is coated on the entire surface and patterned with an exposure and development process to expose the semiconductor layer 20a where the first gate electrode 30a is not formed in an area for an NMOS transistor and the semiconductor layer 20a at both sides of the second gate electrode 30b in an area of a PMOS transistor. With the patterned photoresist film 31 serving as a mask, boron ions of P type having a concentration of 1E15~5E15 cm$^{-2}$ are injected to form source/drain regions 32a/32b in the p type semiconductor layer 20b. These source/drain regions 32a/32b have an LDD (lightly doped drain) structure.

Referring to FIG. 3J, a photoresist film 33 is coated and patterned with an exposure and development process to expose the semiconductor layer 20a where the second gate electrode 30b is not formed in the PMOS transistor and the first gate electrode 30a and the semiconductor layer 20a at both sides of the gate electrode 30a. With the patterned photoresist film 33 serving as a mask, n type As ions having a concentration of 1E15~5E15 cm$^{-2}$ are injected so that an n type semiconductor layer 20c and source/drain regions 34a/34b having an LDD structure are formed.

Referring to FIG. 3K, an interlayer insulating film 35 is deposited and removed to expose predetermined areas of the p and n type semiconductor layers 20b and 20c and predetermined areas of the p and n type source/drain regions 32a/32b and 34a/34b, thereby forming contact holes. Next, a metal layer or a semiconductor layer is formed to fill the contact holes and anisotropically etched to form contact pads 36a and 36f on the p and n type semiconductor layers 20b and 20c, respectively, and line layers 36b, 36c, 36d, 36e on the n and p source/drain regions 32a/32b, and 34a/34b.

Since the channel region of the NMOS transistor is connected to the contact pad 36a through the p type heavily doped polysilicon layer 23a and the p type semiconductor layer 20b, holes generated at the channel are not accumulated at the channel but drained to an outer terminal. Since the channel region of the PMOS transistor is connected to the contact pad 36f through the n type heavily doped polysilicon layer 23b and the n type semiconductor layer 20c, holes generated at the channel are not accumulated but drain to an outer terminal. Therefore, there is no floating body effect generated.

The SOI device and the method for fabricating the same of the present invention have the following advantage. Channels of NMOS and PMOS transistors are designed to be electrically connected to contact pads, floating body effect is reduced, thereby enhancing the performance of a device.

It will be apparent to those skilled in the art that various modification and variations can be made in the SOI device and the method for fabricating the same of the present invention without departing from the spirit or scope of the inventions. Thus, it is intended that the present invention cover the modifications and variations of this invention provided they come within the scope of the appended claims and their equivalents.

What is claimed is:

1. A method for fabricating an SOI device comprising the steps of:
    forming first insulating films formed in a first semiconductor substrate to be spaced apart by a predetermined distance;
    forming first buried insulating layers to expose predetermined areas of the first semiconductor substrate between the first insulating films;
    forming a first silicon layer on the first semiconductor substrate including the first buried insulating layers;
    forming a second buried insulating layer on a second semiconductor substrate;
    bonding the first silicon layer with the second buried insulating layer;
    polishing the first semiconductor substrate until the first insulating films are exposed to form semiconductor layers of first and second regions;
    implanting ions into the first silicon layer to form a first conductivity type silicon layer;
    forming a gate electrode on the semiconductor layer of the first region;
    implanting ions into the semiconductor layer of the second region to form a second conductivity type semiconductor layer;
    forming impurity regions in the semiconductor layer of the first region at both sides of the gate electrode; and
    forming a contact pad in contact with the second conductivity type semiconductor layer and simultaneously line layers in contact with the impurity regions.

2. The method as claimed in claim 1, wherein the first buried insulating layer is formed by removing the first buried insulating layer under the gate electrode and a first conductivity type semiconducrtor layer under the contact pads.

3. The method as claimed in claim 1, wherein the first buried insulating layer is formed to connect a first conductivity type semiconductor layer under contact pad with a portion of the impurity region at one side of the gate electrode.

4. The method as claimed in claim 1, wherein the first insulating layer is formed to expose a first conductivity type semiconductor layer under the contact pad, a center portion of the impurity region at one side of the gate electrode, and the adjoining gate electrode.

5. The method as claimed in claim 1, wherein the first buried insulating film is formed to expose a first conductivity type semiconductor layer and a portion of an active region.

6. A method for fabricating an SOI device comprising the steps of:
    forming first insulating films in a first semiconductor substrate to be spaced apart by a predetermined distance;
    forming first buried insulating layers on the first semiconductor substrate to expose predetermined areas of the first semiconductor substrate between the first insulating films but not the first semiconductor substrate between the two central first insulating films;
    forming a first silicon layer on the first semiconductor substrate including the first buried insulating films;
    forming a second buried insulating film on a second semiconductor substrate;
    bonding the first silicon layer and the second buried insulating film;
    polishing the first semiconductor substrate until the first insulating film is exposed to form semiconductor layers of first and second regions;
    etching the first semiconductor substrate, the first buried insulating layer, and the first silicon layer to expose the first buried insulating film, so as to form an isolation insulating film;
    implanting ions into the first silicon layer at one side of the isolation insulating film to form a first conductivity type silicon layer;
    implanting ions into the first silicon layer at the other side of the isolation insulating film to form a second conductivity type silicon layer;
    forming first and second gate electrodes on the semiconductor layers of the first and second regions, respectively;
    forming a first conductivity type semiconductor layer at the semiconductor layer of the second region at one side of the isolation insualting film and simultaneously impurity regions in the semiconductor layer at both sides of the second gate electrode of the first region at the other side of the isolation insulating film;
    forming a second conductivity type semiconductor layer at the semiconductor layer of the second region at the other side of the isolation insualting film and simultaneously impurity region in the semiconductor layer of the first region at both sides of the first gate electrode at the one side of the isolation insualting film; and
    forming contact pads in contact with the first and second conductivity type semiconductor layers and simultaneously line in contact with the impurity regions at both sides of the first and second gate electrodes.

7. The method as claimed in claim 6, wherein the first buried insualting layers are formed to remove the first buried insulating layers under the first and second conductivity type semiconductor layers for contact pads and the first and second gate electrodes.

8. The method as claimed in claim 6, wherein the first buried insulating layers are formed to connect the first and second conductivity type semiconductor layers with predetermined areas for the impurity regions at one side of the first and second gate electrodes.

9. The method as claimed in claim 6, wherein the first buried insulating layers are formed to expose the first and second conductivity type semiconductor layers and center portions of the impurity regions at one side of each of the first and second gate electrodes and adjoining portions for the first and second gate electrodes.

10. The method as claimed in claim 6, wherein the first buried insulating layers are formed to expose the first and second conductivity type semiconductor layers for contact pads and predetermined areas of the semiconductor layer of the first region except for first and second gate electrodes and the impurity regions.

* * * * *